(12) United States Patent
Iwaya et al.

(10) Patent No.: US 9,540,519 B2
(45) Date of Patent: Jan. 10, 2017

(54) FORMED ARTICLE, METHOD FOR PRODUCING SAME, ELECTRONIC DEVICE MEMBER, AND ELECTRONIC DEVICE

(75) Inventors: Wataru Iwaya, Tokyo (JP); Takeshi Kondo, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 1007 days.

(21) Appl. No.: 13/634,713

(22) PCT Filed: Mar. 28, 2011

(86) PCT No.: PCT/JP2011/057610
§ 371 (c)(1),
(2), (4) Date: Dec. 3, 2012

(87) PCT Pub. No.: WO2011/125602
PCT Pub. Date: Oct. 13, 2011

(65) Prior Publication Data
US 2013/0068136 A1    Mar. 21, 2013

(30) Foreign Application Priority Data
Mar. 31, 2010 (JP) ................................ 2010-084227

(51) Int. Cl.
*C23C 14/48* (2006.01)
*C09D 1/00* (2006.01)
(Continued)

(52) U.S. Cl.
CPC .. *C09D 1/00* (2013.01); *C08J 7/04* (2013.01); *C08K 3/346* (2013.01); *C09D 183/16* (2013.01);
(Continued)

(58) Field of Classification Search
None
See application file for complete search history.

(56) References Cited

U.S. PATENT DOCUMENTS 5,143,747 A    9/1992 Matossian et al.
5,411,762 A *  5/1995 Thebault ............. C01B 21/0826
                                         423/327.1
(Continued)

FOREIGN PATENT DOCUMENTS

DE    10 2004 004 177 A1    9/2005
EP        0 285 870 A2     10/1988
(Continued)

OTHER PUBLICATIONS

Nakano et al., "Effects of Si-C Bond Content on Film Properties of Organic Spin-on Glass," J. Electrochem. Soc. (Apr. 1995), vol. 142, No. 4, pp. 1303-1308.
(Continued)

*Primary Examiner* — Kenneth Stachel
(74) *Attorney, Agent, or Firm* — Birch, Stewart, Kolasch & Birch, LLP

(57) ABSTRACT

Provided a formed article comprising a layer that includes a polysilazane compound and a clay mineral, and having a water vapor transmission rate at a temperature of 40° C. and a relative humidity of 90% of 6.0 g/m²/day or less. Also provided are a method for producing the formed article, an electronic device member including the formed article, and an electronic device including the electronic device member. The formed article exhibiting an excellent gas barrier capability, excellent transparency, and excellent bending resistance, a method for producing the formed article, and an electronic device member, or the like, comprising the formed article are provided.

15 Claims, 2 Drawing Sheets

(51) Int. Cl.
  *C08K 3/34*      (2006.01)
  *C09D 183/16*   (2006.01)
  *C08J 7/04*      (2006.01)
  *C08G 77/62*    (2006.01)
  *G02F 1/1333*   (2006.01)

(52) U.S. Cl.
  CPC .............. *C23C 14/48* (2013.01); *C08G 77/62* (2013.01); *C08J 2367/02* (2013.01); *C08J 2483/16* (2013.01); *G02F 1/133305* (2013.01)

(56) References Cited

U.S. PATENT DOCUMENTS

| | | | |
|---|---|---|---|
| 5,458,753 A | 10/1995 | Sato et al. | |
| 5,907,382 A | 5/1999 | Kajiura et al. | |
| 5,989,945 A * | 11/1999 | Yudasaka | G02F 1/136227 257/347 |
| 6,194,328 B1 | 2/2001 | Chen et al. | |
| 6,251,981 B1 | 6/2001 | Tanaka et al. | |
| 6,300,641 B1 | 10/2001 | Koh et al. | |
| 6,352,931 B1 | 3/2002 | Seta et al. | |
| 6,416,817 B1 | 7/2002 | Rangwalla et al. | |
| 6,828,381 B1 | 12/2004 | Armbrust et al. | |
| 2001/0018491 A1 | 8/2001 | Shiono et al. | |
| 2002/0034885 A1 | 3/2002 | Shindo | |
| 2002/0059899 A1 | 5/2002 | Seta et al. | |
| 2002/0063830 A1 | 5/2002 | Callegari et al. | |
| 2002/0102843 A1 | 8/2002 | Seta et al. | |
| 2003/0165696 A1 | 9/2003 | Namiki et al. | |
| 2003/0224611 A1 | 12/2003 | Seta et al. | |
| 2003/0228475 A1 | 12/2003 | Komada | |
| 2004/0046497 A1 | 3/2004 | Schaepkens et al. | |
| 2004/0116555 A1 | 6/2004 | Naruse et al. | |
| 2004/0146660 A1 | 7/2004 | Goodwin et al. | |
| 2004/0253451 A1 | 12/2004 | Kawashima et al. | |
| 2004/0265554 A1 | 12/2004 | Miyadera et al. | |
| 2005/0017633 A1 | 1/2005 | Miyadera | |
| 2005/0079380 A1 | 4/2005 | Iwanaga | |
| 2005/0082674 A1 | 4/2005 | Seta et al. | |
| 2005/0202259 A1 | 9/2005 | Korevaar et al. | |
| 2005/0287307 A1 | 12/2005 | Singh et al. | |
| 2006/0017162 A1 | 1/2006 | Seta et al. | |
| 2006/0232735 A1 | 10/2006 | Hokazono et al. | |
| 2007/0026168 A1 | 2/2007 | Kishimoto et al. | |
| 2007/0268089 A1 | 11/2007 | McKenzie et al. | |
| 2008/0018230 A1 | 1/2008 | Yamada et al. | |
| 2008/0096014 A1 | 4/2008 | Griesser et al. | |
| 2008/0305359 A1 | 12/2008 | Aiba et al. | |
| 2008/0318067 A1 | 12/2008 | Itoh et al. | |
| 2009/0021150 A1 | 1/2009 | Kim et al. | |
| 2009/0022907 A1 | 1/2009 | Kim et al. | |
| 2009/0110892 A1 | 4/2009 | Erlat et al. | |
| 2009/0130463 A1 | 5/2009 | Albaugh et al. | |
| 2009/0139564 A1 | 6/2009 | Miyaji et al. | |
| 2009/0148633 A1 | 6/2009 | Inagaki et al. | |
| 2009/0214882 A1 | 8/2009 | Sakakura | |
| 2009/0252975 A1 | 10/2009 | Lee et al. | |
| 2010/0003482 A1 | 1/2010 | Fukuda | |
| 2010/0003483 A1 | 1/2010 | Fukuda | |
| 2010/0216264 A1 | 8/2010 | Matsumoto et al. | |
| 2011/0185948 A1 | 8/2011 | Uemura et al. | |
| 2011/0189450 A1 | 8/2011 | Hoshi et al. | |
| 2011/0274933 A1 | 11/2011 | Hoshi et al. | |
| 2012/0064321 A1 | 3/2012 | Suzuki et al. | |
| 2012/0101221 A1 | 4/2012 | Hoshi et al. | |
| 2012/0108761 A1 | 5/2012 | Hoshi et al. | |
| 2012/0208086 A1 | 8/2012 | Plieth et al. | |
| 2012/0295120 A1 | 11/2012 | Nagamoto et al. | |

FOREIGN PATENT DOCUMENTS

| | | |
|---|---|---|
| EP | 2 410 005 A1 | 1/2012 |
| EP | 2 412 522 A1 | 2/2012 |
| EP | 2 615 144 A1 | 7/2013 |
| JP | 62-220330 A | 9/1987 |
| JP | 5-185568 A | 7/1993 |
| JP | 6-64105 A | 3/1994 |
| JP | 6-187833 A | 7/1994 |
| JP | 7-292321 A | 11/1995 |
| JP | 8-45452 A | 2/1996 |
| JP | 8-57560 A | 3/1996 |
| JP | 8-174748 A | 7/1996 |
| JP | 8-302043 A | 11/1996 |
| JP | 09-010687 A | 1/1997 |
| JP | 9-26755 A | 1/1997 |
| JP | 9-124807 A | 5/1997 |
| JP | 10-244613 A | 9/1998 |
| JP | 10-249990 A | 9/1998 |
| JP | 10-305542 A | 11/1998 |
| JP | 2000-246830 A | 9/2000 |
| JP | 2000-254996 A | 9/2000 |
| JP | 2000-260870 A | 9/2000 |
| JP | 2000-338901 A | 12/2000 |
| JP | 2000-340166 A | 12/2000 |
| JP | 2001-119051 A | 4/2001 |
| JP | 2001-207259 A | 7/2001 |
| JP | 2002-18246 A | 1/2002 |
| JP | 2002-105676 A | 4/2002 |
| JP | 2003-8179 A | 1/2003 |
| JP | 2003-118029 A | 4/2003 |
| JP | 2003-154596 A | 5/2003 |
| JP | 2003-525995 A | 9/2003 |
| JP | 2003-347570 A | 12/2003 |
| JP | 2004-119138 A | 4/2004 |
| JP | 2004-527642 A | 9/2004 |
| JP | 2004-530790 A | 10/2004 |
| JP | 2004-322489 A | 11/2004 |
| JP | 2004-352966 A | 12/2004 |
| JP | 2005-88431 A | 4/2005 |
| JP | 2005-104025 A | 4/2005 |
| JP | 2005-119155 A | 5/2005 |
| JP | 2005-119160 A | 5/2005 |
| JP | 2005-169994 A | 6/2005 |
| JP | 2005-231039 A | 9/2005 |
| JP | 2005-240061 A | 9/2005 |
| JP | 2005-537963 A | 12/2005 |
| JP | 2006-35737 A | 2/2006 |
| JP | 2006-52376 A | 2/2006 |
| JP | 2006-70238 A | 3/2006 |
| JP | 2006-123306 A | 5/2006 |
| JP | 2006-123307 A | 5/2006 |
| JP | 2006-192858 A | 7/2006 |
| JP | 2006-264118 A | 10/2006 |
| JP | 2007-022075 A | 2/2007 |
| JP | 2007-042616 A | 2/2007 |
| JP | 2007-065644 A | 3/2007 |
| JP | 2007-237588 A | 9/2007 |
| JP | 2007-528447 A | 10/2007 |
| JP | 2007-283726 A | 11/2007 |
| JP | 2008-015500 A | 1/2008 |
| JP | 2008-504687 A | 2/2008 |
| JP | 2008-49601 A | 3/2008 |
| JP | 2008-62498 A | 3/2008 |
| JP | 2008-174792 A | 7/2008 |
| JP | 2008-204683 A | 9/2008 |
| JP | 2008-235165 A | 10/2008 |
| JP | 2008-246893 A | 10/2008 |
| JP | 2008-246894 A | 10/2008 |
| JP | 2008-270115 A | 11/2008 |
| JP | 2009-110897 A | 5/2009 |
| JP | 2009-199812 A | 9/2009 |
| JP | 2009-252574 A | 10/2009 |
| JP | 2009-287006 A | 12/2009 |
| JP | 2011-718 A | 1/2011 |
| WO | WO 2006/015757 A1 | 2/2006 |
| WO | WO 2006/090602 A1 | 8/2006 |
| WO | WO 2007/040039 A1 | 4/2007 |
| WO | WO 2007/044181 A2 | 4/2007 |
| WO | WO 2008/096617 A1 | 8/2008 |
| WO | WO 2010/002182 A2 | 1/2010 |
| WO | WO 2010/021326 A1 | 2/2010 |
| WO | WO 2010/024378 A1 | 3/2010 |
| WO | WO 2010/067857 A1 | 6/2010 |

(56) References Cited

FOREIGN PATENT DOCUMENTS

| WO | WO 2010/107018 A1 | 9/2010 |
|---|---|---|
| WO | WO 2010/134609 A1 | 11/2010 |
| WO | WO 2010/134611 A1 | 11/2010 |

OTHER PUBLICATIONS

Office Action issued Dec. 2, 2015, in U.S. Appl. No. 13/144,856.
Office Action issued Nov. 30, 2015, in U.S. Appl. No. 13/128,348.
International Search Report for International Application No. PCT/JP2009/070728 dated Feb. 9, 2010.
International Search Report for International Application No. PCT/JP2010/052058 dated Jun. 1, 2010.
International Search Report for International Application No. PCT/JP2010/058668 dated Aug. 10, 2010.
International Search Report for International Application No. PCT/JP2011/051507 dated May 10, 2011 (with English translation).
International Search Report for International Application No. PCT/JP2011/071208 dated Nov. 8, 2011.
International Search Report for International Application No. PCT/JP2011/071353 dated Nov. 8, 2011.
Kobayashi et al., "Surface modification of silicone sheets and tubes using plasma-based ion implantation," Surface & Coatings Technology, vol. 201, 2007, pp. 8039-8042.
Machine English translation for JP-2006-70238-A dated Mar. 16, 2006.
Nakagawara et al., "Moisture-resistant ZnO transparent conductive films with Ga heavy doping", Applied Physics Letters, vol. 89, 2006, pp. 091904-1-091904-3.
Schauer et al., "Luminescence as a tool for crosslinking determination in plasma polysilylenes prepared from organosilanes", Synthetic Metals, vol. 109, 2000, pp. 321-325.
United States Office Action for copending U.S. Appl. No. 13/055,274 dated Nov. 7, 2013.
United States Office Action for copending U.S. Appl. No. 13/128,348 dated Feb. 14, 2013.
United States Office Action for copending U.S. Appl. No. 13/128,348 dated Sep. 13, 2013.
United States Office Action for copending U.S. Appl. No. 13/144,856 dated Mar. 15, 2013.
United States Office Action for copending U.S. Appl. No. 13/144,856 dated Oct. 18, 2013.
United States Office Action for copending U.S. Appl. No. 13/256,143 dated Nov. 21, 2013.
United States Office Action for copending U.S. Appl. No. 13/321,687 dated Jan. 15, 2014.
United States Office Action for copending U.S. Appl. No. 13/321,687 dated Oct. 8, 2013.
United States Office Action for copending U.S. Appl. No. 13/826,954 dated Nov. 7, 2013.
Gelamo et al., "Infrafred spectroscopy investigation of various plasma-deposited polymer films irradiated with 170 keV He+ ions," Nuclear Instruments and Methods in Physics Research B (2006), vol. 249, pp. 162-166.
Office Action issued Feb. 5, 2013, in U.S. Appl. No. 14/484,573.
U.S. Office Action, dated Aug. 19, 2015, for U.S. Appl. No. 13/818,050.
Office Action issued Nov. 4, 2015, in U.S. Appl. No. 13/321,687.
International Search Report for International Application No. PCT/JP2009/064457 dated Dec. 1, 2009.
International Search Report for International Application No. PCT/JP2010/055064 dated May 11, 2010.
International Search Report for International Application No. PCT/JP2011/057608 dated on Apr. 26, 2011.
International Search Report for International Application No. PCT/JP2011/071203 dated Nov. 8, 2011.
United States Office Action for U.S. Appl. No. 13/055,274 dated Apr. 16, 2013.
United States Office Action for U.S. Appl. No. 13/256,143 dated Aug. 6, 2013.
United States Office Action for U.S. Appl. No. 13/823,688 dated Nov. 8, 2013.
Office Action issued Oct. 7, 2015, in U.S. Appl. No. 13/634,410.
Final Office Action issued Jan. 15, 2016, in U.S. Appl. No. 14/484,573.
Non-Final Office Action issued Feb. 25, 2014, in U.S. Appl. No. 13/823,688.
Notice of Allowance issued Feb. 28, 2014 in U.S. Appl. No. 13/826,954.
Office Action issued May 28, 2015, in U.S. Appl. No. 13/128,348.
Extended European Search Report issued Feb. 17, 2014, in European Patent Application No. 11826800.2.
Extended European Search Report issued Mar. 27, 2014, in European Patent Application No. 11818032.2.
Extended European Search Report, dated Feb. 5, 2014, for European Application No. 11762771.1.
International Search Report for PCT/JP2011/067046 mailed on Aug. 23, 2011.
United States Advisory Action for U.S. Appl. No. 13/055,274 dated Apr. 15, 2014.
United States Advisory Action for copending U.S. Appl. No. 13/128,348 dated Feb. 10, 2014.
United States Advisory Action for copending U.S. Appl. No. 13/144,856 dated Mar. 3, 2014.
United States Notice of Allowance for U.S. Appl. No. 13/823,688, dated Jun. 4, 2014.
United States Notice of Allowance, for U.S. Appl. No. 13/256,143, dated Jun. 24, 2014.
United States Office Action for U.S. Appl. No. 13/634,378 dated Feb. 19, 2014.
United States Office Action for U.S. Appl. No. 13/634,378, dated Jan. 15, 2014.
Written Opinion of the International Search Authority for PCT/JP2011/067046 mailed on Aug. 23, 2011 (Japanese).
International Search Report for PCT/JP2011/057610 dated Jul. 5, 2011.
Restriction Requirement issued Oct. 3, 2014, in U.S. Appl. No. 13/818,050.
Bodo, P. et al., "Titanium deposition onto ion-bombarded and plasma-treated polydimethylsiloxane: Surface modification, interface and adhesion", Thin Solid Films, Elsevier-Sequoia, Feb. 1, 1986, vol. 136, No. 1, pp. 147-159.
Extended European Search Report issued Sep. 25, 2014, in European Patent Application No. 10756100.3.
Igarashi, A. et al., "Structure and morphology of diamond-like carbon coated on nylon 66/poly(phenylene ether) alloy", J. of Molecular Structure, Elsevier, Amsterdam, NL, vol. 788, No. 1-3, May 8, 2006, pp. 238-245.
Tsuji, H et al., "Improvement of polydimethylsiloxane guide tube for nerve regeneration treatment by carbon negative-ion implantation", Nuclear Instruments and Methods in Physics Research, Section B: Beam Interactions with Materials and Atoms, Elsevier, May 1, 2003, vol. 206, pp. 507-511.
Balabanov, S. et al., "Spectral distribution of UV range diffuse reflectivity for Si+ ion implanted polymers", J. of Physics: Conference Series, institute of Publishing, Bristol, vol. 113, No. 1, May 1, 2008.
Notice of Allowance issued Apr. 29, 2014, in U.S. Appl. No. 13/256,143.
Office Action issued Feb. 12, 2015, in U.S. Appl. No. 13/818,050.
Restriction Requirement issued Jun. 4, 2015, in U.S. Appl. No. 13/634,410.
CAS Registry No. 151772-74-6, Scifinder ACS, 2014, 3 pages.
United States Office Action, dated Aug. 1, 2014, for U.S. Appl. No. 13/321,687.
United States Office Action, dated Aug. 8, 2014, for U.S. Appl. No. 13/055,274.
Moriya et al., "Modification Effects in Ion-Implanted $SiO_2$ Spin-on-Glass," J. Electrochem. Soc. (May 1993), vol. 140, No. 5, pp. 1442-1450.
Office Action issued Jun. 8, 2015, in U.S. Appl. No. 13/144,856.
Final Office Action issued Feb. 27, 2015, in U.S. Appl. No. 13/055,274.

(56) References Cited

OTHER PUBLICATIONS

European Search Report dated Aug. 29, 2013, issued in corresponding European patent application No. 11765502.7.
Final Office Action issued Jun. 10, 2016, in U.S. Appl. No. 13/128,348.
Final Office Action issued Jun. 8, 2016, in U.S. Appl. No. 13/634,410.
Office Action issued Feb. 12, 2016, in U.S. Appl. No. 13/818,050.
Bechtold et al., "Polymerization and Polymers of Silicic Acid," Journal of Polymer Science: Polymer Chemistry Edition (1980), vol. 18, pp. 2823-2855.
Final Office Action issued Aug. 25, 2016, in U.S. Appl. No. 13/144,856.
Office Action issued Aug. 25, 2016, in U.S. Appl. No. 14/484,573.
Pivin et al., "Comparison of Ion Irradiation Effects in Silicon-Based Preceramic Thin Films," J. Am Ceram. Soc. (2000), vol. 83, No. 4, pp. 713-720.
Restriction Requirement issued Sep. 9, 2016, in U.S. Appl. No. 13/823,636.
U.S. Appl. No. 14/484,573, filed Sep. 12, 2014.
U.S. Appl. No. 13/055,274, filed Apr. 19, 2011.
U.S. Appl. No. 13/128,348, filed Jul. 27, 2011.
U.S. Appl. No. 13/144,856, filed Sep. 20, 2011.
U.S. Appl. No. 13/321,687, filed Jan. 9, 2012.
U.S. Appl. No. 13/577,020, filed Aug. 3, 2012.

* cited by examiner (a)

(b)

US 9,540,519 B2

FORMED ARTICLE, METHOD FOR PRODUCING SAME, ELECTRONIC DEVICE MEMBER, AND ELECTRONIC DEVICE

TECHNICAL FIELD

The invention relates to a formed article, a method for producing the same, an electronic device member that includes the formed article, and an electronic device that includes the electronic device member.

BACKGROUND ART

A polymer formed article (e.g., plastic film) that is inexpensive and exhibits excellent workability has been provided with a desired function, and used in various fields.

For example, a gas bather plastic film that does not allow water vapor and oxygen to pass through is used as a food/drug packaging film in order to suppress oxidation and denaturation of proteins, oils, fats, and the like to keep taste and freshness.

In recent years, use of a transparent plastic film as an electrode substrate instead of a glass plate has been studied for displays (e.g., liquid crystal display and electroluminescence (EL) display) in order to implement a reduction in thickness, a reduction in weight, an improvement in flexibility, and the like. However, since a plastic film tends to allow water vapor, oxygen, and the like to pass through as compared with a glass plate, elements provided in a display may deteriorate.

In order to solve this problem, Patent Document 1 proposes a flexible display substrate in which a transparent gas barrier layer formed of a metal oxide is stacked on a transparent plastic film.

However, since the transparent gas barrier layer formed of a metal oxide is stacked on the surface of the transparent plastic film by deposition, ion plating, sputtering, or the like, cracks may occur in the gas barrier layer when the substrate is rolled up or bent, so that the gas barrier capability may deteriorate.

Patent Document 2 discloses a gas barrier laminate that includes a plastic film, and a resin layer that contains a polyorganosilsesquioxane as the main component and is stacked on at least one side of the plastic film.

However, since it is necessary to further stack an inorganic compound layer in order to obtain a gas (e.g., oxygen and water vapor) barrier capability, the process becomes complex, the production cost increases, or toxic gas may be used during the production process.

Patent Document 3 discloses a method that forms a polysilazane film on at least one side of a film, and subjects the polysilazane film to a plasma treatment to produce a gas barrier film.

When using the method disclosed in Patent Document 3, however, a sufficient gas barrier capability cannot be obtained unless the thickness of the gas barrier layer is reduced to a micrometer level.

RELATED-ART DOCUMENT

Patent Document

Patent Document 1: JP-A-2000-338901
Patent Document 2: JP-A-2006-123307
Patent Document 3: JP-A-2007-237588

SUMMARY OF THE INVENTION

Technical Problem

The invention was conceived in view of the above situation. An object of the invention is to provide a formed article that exhibits an excellent gas barrier capability, excellent transparency, and excellent bending resistance, a method for producing the same, an electronic device member that includes the formed article, and an electronic device that includes the electronic device member.

Solution to Problem

The inventors of the invention conducted extensive studies in order to achieve the above object, and found that a desired formed article can be conveniently and efficiently produced by implanting ions into a layer that is included in a formed body and includes a polysilazane compound and a clay mineral, the formed body including the layer that includes the polysilazane compound and the clay mineral in a surface area. This finding has led to the completion of the invention.

A first aspect of the invention provides the following molded article (see (1) to (6)).

(1) A formed article including a layer that includes a polysilazane compound and a clay mineral, and having a water vapor transmission rate at a temperature of 40° C. and a relative humidity of 90% of 6.0 $g/m^2$/day or less.

(2) The formed article according to (1), the formed article including a layer obtained by implanting ions into the layer that includes the polysilazane compound and the clay mineral.

(3) The formed article according to (2), wherein the ions are obtained by ionizing at least one gas selected from a group consisting of hydrogen, nitrogen, oxygen, argon, helium, neon, xenon, krypton, a silicon compound, and a hydrocarbon.

(4) The formed article according to (2) or (3), the formed article including a layer obtained by implanting ions into the layer that includes the polysilazane compound and the clay mineral by a plasma ion implantation method.

(5) The formed article according to (1) or (2), wherein the polysilazane compound is perhydropolysilazane.

(6) The formed article according to (1) or (2), wherein a content of the clay mineral in the layer that includes the polysilazane compound and the clay mineral is 0.01 to 10 mass % based on a total content (=100 mass %) of the polysilazane compound and the clay mineral.

A second aspect of the invention provides the following method for producing a formed article (see (7) to (10)).

(7) A method for producing the formed article according to (2), the method including implanting ions into a surface area of a layer that is included in a formed body and includes a polysilazane compound and a clay mineral, the formed body including the layer that includes the polysilazane compound and the clay mineral in a surface area.

(8) The method according to (7), including implanting ions of at least one gas selected from a group consisting of hydrogen, nitrogen, oxygen, argon, helium, xenon, neon, krypton, a silicon compound, and a hydrocarbon into the surface area of the layer that includes the polysilazane compound and the clay mineral.

(9) The method according to (7) or (8), wherein the ions are implanted by a plasma ion implantation method.

(10) A method for producing the formed article according to (2), the method including implanting ions into a layer that is included in a long formed body and includes a polysilazane compound and a clay mineral while feeding the formed body in a given direction, the formed body including the layer that includes the polysilazane compound and the clay mineral in a surface area.

A third aspect of the invention provides the following electronic device member (see (11)).

(11) An electronic device member including the formed article according to (1) or (2).

A fourth aspect of the invention provides the following electronic device (see (12)).

(12) An electronic device including the electronic device member according to (11).

Advantageous Effects of the Invention

The formed article according to the first aspect of the invention exhibits an excellent gas barrier capability, excellent transparency, and excellent bending resistance. The formed article according to the first aspect of the invention may suitably be used as an electronic device member (e.g., solar cell backsheet) for flexible displays, solar cells, and the like.

The method for producing a formed article according to the second aspect of the invention can conveniently and efficiently produce the formed article according to the first aspect of the invention that exhibits an excellent gas barrier capability, excellent transparency, and excellent bending resistance. Moreover, the area of the formed article can be easily and inexpensively increased as compared with a formed article in which an inorganic film is formed as a gas barrier film.

The electronic device member according to the third aspect of the invention exhibits an excellent gas barrier capability, excellent transparency, and excellent bending resistance, and may suitably be used for electronic devices such as displays and solar cells.

DESCRIPTION OF EMBODIMENTS

Figure 1:
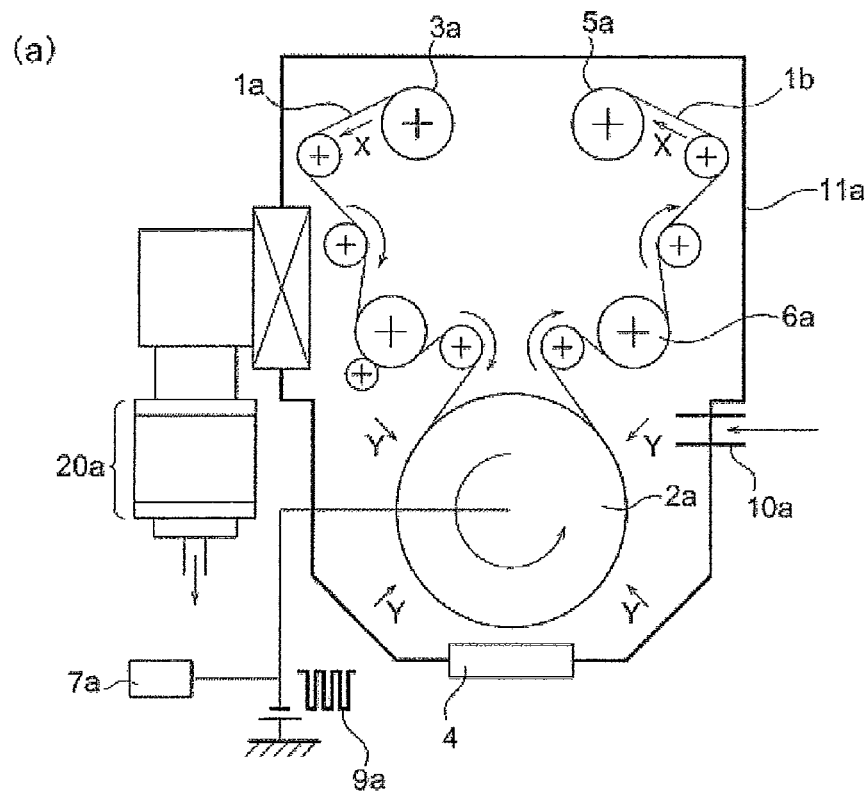
FIG. 1 is a view illustrating a schematic configuration of a plasma ion implantation apparatus.
Figure 1:
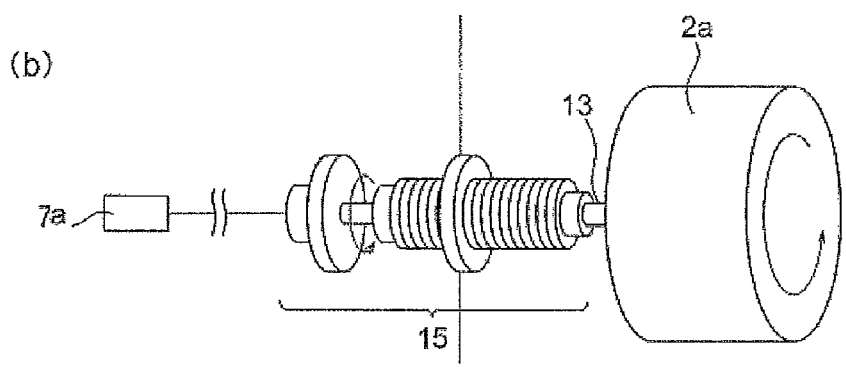

A formed article, a method for producing a formed article, an electronic device member, and an electronic device according to embodiments of the invention are described in detail below.

1) Formed Article

A formed article according to one embodiment of the invention includes a layer that includes a polysilazane compound and a clay mineral (hereinafter may be referred to as "clay mineral-containing layer"), and has a water vapor transmission rate at a temperature of 40° C. and a relative humidity of 90% of 6.0 g/m$^2$/day or less.

The polysilazane compound used in connection with the invention is a polymer compound that includes a repeating unit that includes an —Si—N— bond (silazane bond) in the molecule. The polysilazane compound is preferably a compound that includes a repeating unit shown by the following formula (1).

[Chemical Formula 1]

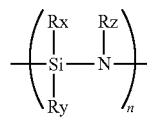

(1)

The number average molecular weight of the polysilazane compound is not particularly limited, but is preferably 100 to 50,000.

Note that n in the formula (1) is an arbitrary natural number.

Rx, Ry, and Rz independently represent a hydrogen atom or a non-hydrolyzable group such as a substituted or unsubstituted alkyl group, a substituted or unsubstituted cycloalkyl group, a substituted or unsubstituted alkenyl group, a substituted or unsubstituted aryl group, or an alkylsilyl group.

Examples of the unsubstituted alkyl group include alkyl groups having 1 to 10 carbon atoms (e.g., methyl group, ethyl group, n-propyl group, isopropyl group, n-butyl group, isobutyl group, sec-butyl group, t-butyl group, n-pentyl group, isopentyl group, neopentyl group, n-hexyl group, n-heptyl group, and n-octyl group).

Examples of the unsubstituted cycloalkyl group include cycloalkyl groups having 3 to 10 carbon atoms (e.g., cyclobutyl group, cyclopentyl group, cyclohexyl group, and cycloheptyl group).

Examples of the unsubstituted alkenyl group include alkenyl groups having 2 to 10 carbon atoms (e.g., vinyl group, 1-propenyl group, 2-propenyl group, 1-butenyl group, 2-butenyl group, and 3-butenyl group).

Examples of a substituent that may substitute the alkyl group, the cycloalkyl group, and the alkenyl group include halogen atoms such as a fluorine atom, a chlorine atom, a bromine atom, and an iodine atom; a hydroxyl group; a thiol group; an epoxy group; a glycidoxy group; a (meth)acryloyloxy group; substituted or unsubstituted aryl groups such as a phenyl group, a 4-methylphenyl group, and a 4-chlorophenyl group; and the like.

Examples of the unsubstituted aryl group include aryl groups having 6 to 10 carbon atoms (e.g., phenyl group, 1-naphthyl group, and 2-naphthyl group).

Examples of a substituent that may substitute the aryl group include halogen atoms such as a fluorine atom, a chlorine atom, a bromine atom, and an iodine atom; alkyl groups having 1 to 6 carbon atoms, such as a methyl group and an ethyl group; alkoxy groups having 1 to 6 carbon atoms, such as a methoxy group and an ethoxy group; a nitro group; a cyano group; a hydroxyl group; a thiol group; an epoxy group; a glycidoxy group; a (meth)acryloyloxy group; substituted or unsubstituted aryl groups such as a phenyl group, a 4-methylphenyl group, and a 4-chlorophenyl group; and the like.

Examples of the alkylsilyl group include a trimethylsilyl group, a triethylsilyl group, a triisopropylsilyl group, a tri-t-butylsilyl group, a methyldiethylsilyl group, a dimethylsilyl group, a diethylsilyl group, a methylsilyl group, an ethylsilyl group, and the like.

Among these, a hydrogen atom, an alkyl group having 1 to 6 carbon atoms, or a phenyl group is preferable as Rx, Ry, and Rz. A hydrogen atom is particularly preferable as Rx, Ry, and Rz.

The polysilazane compound that includes the repeating unit shown by the formula (1) may be an inorganic polysilazane in which Rx, Ry, and Rz represent a hydrogen atom, or an organic polysilazane in which at least one of Rx, Ry, and Rz does not represent a hydrogen atom.

Examples of the inorganic polysilazane include a perhydropolysilazane that has a linear structure that includes a repeating unit shown by the following formula, has a molecular weight of 690 to 2000, and includes 3 to 10 SiH$_3$ groups in one molecule (see JP-B-S63-16325),

[Chemical Formula 2]

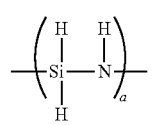

wherein a is an arbitrary natural number, a perhydropolysilazane that has a linear structure and a branched structure, and includes a repeating unit shown by the following formula (A),

[Chemical Formula 3]

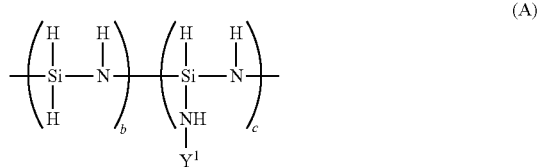

(A)

wherein b and c are arbitrary natural numbers, and $Y^1$ represents a hydrogen atom or a group shown by the following formula (B),

[Chemical Formula 4]

(B)

wherein d is an arbitrary natural number, * indicates the bonding position, and $Y^2$ represents a hydrogen atom or the group shown by the formula (B),
a perhydropolysilazane that has a linear structure, a branched structure, and a cyclic structure in the molecule, and includes the perhydropolysilazane structure shown by the following formula (C),

[Chemical Formula 5]

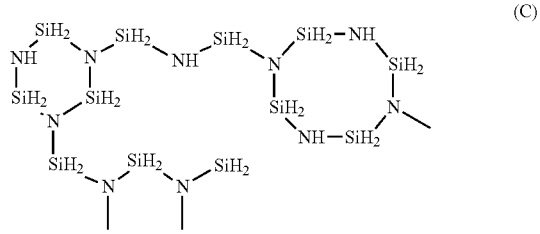

(C)

and the like.

Examples of the organic polysilazane include (i) a polysilazane that includes a repeating unit shown by -(Rx'SiHNH)— (wherein Rx' represents a substituted or unsubstituted allyl group, a substituted or unsubstituted cycloalkyl group, a substituted or unsubstituted alkenyl group, a substituted or unsubstituted awl group, or an alkylsilyl group (hereinafter Rx' is the same)), and has a cyclic structure having mainly a degree of polymerization of 3 to 5,
(ii) a polysilazane that includes a repeating unit shown by -(Rx'SiHNRz')- (wherein Rz' represents a substituted or unsubstituted alkyl group, a substituted or unsubstituted cycloalkyl group, a substituted or unsubstituted alkenyl group, a substituted or unsubstituted aryl group, or an alkylsilyl group), and has a cyclic structure having mainly a degree of polymerization of 3 to 5,
(iii) a polysilazane that includes a repeating unit shown by -(Rx'Ry'SiNH)— (wherein Ry' represents a substituted or unsubstituted alkyl group, a substituted or unsubstituted cycloalkyl group, a substituted or unsubstituted alkenyl group, a substituted or unsubstituted awl group, or an alkylsilyl group), and has a cyclic structure having mainly a degree of polymerization of 3 to 5, (iv) a polyorgano(hydro)silazane that includes a structure shown by the following formula in the molecule,

[Chemical Formula 6]

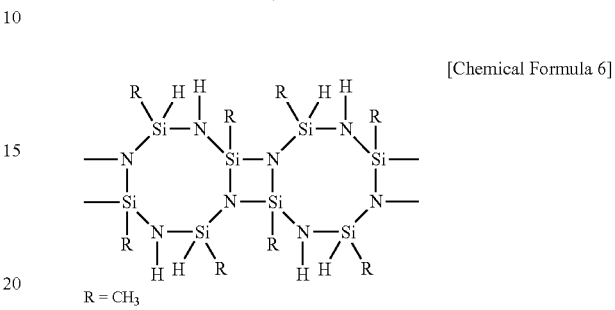

$R = CH_3$ (v) a polysilazane that includes a repeating unit shown by the following formula,

[Chemical Formula 7]

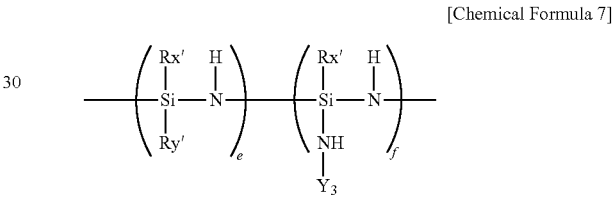

wherein Rx' and Ry' are the same as defined above, e and f are arbitrary natural numbers, and $Y^3$ represents a hydrogen atom or a group shown by the following formula (E),

[Chemical Formula 8]

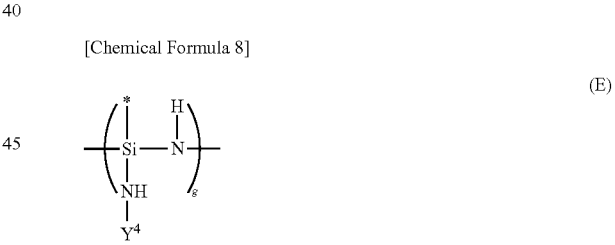

(E)

wherein g is an arbitrary natural number, * indicates the bonding position, and $Y^4$ represents a hydrogen atom or a group shown by the formula (E), and the like.

The above organic polysilazanes may be produced by a known method. For example, the above organic polysilazanes may be produced by reacting ammonia or a primary amine with a reaction product of a substituted or unsubstituted halogenosilane compound shown by the following formula (2) and a secondary amine.

[Chemical Formula 9]

$R^1{}_{4-m}SiX_m$ (2)

wherein m is 2 or 3, X represents a halogen atom, and $R^1$ represents the substituent Rx, Ry, Rz, Ry', or Rz'.
The secondary amine, ammonia, and the primary amine may be appropriately selected depending on the structure of the target polysilazane compound.

A modified polysilazane may also be used as the polysilazane compound. Examples of the modified polysilazane include a polymetallosilazane that includes a metal atom (which may be crosslinked), a polysiloxazane that includes a repeating unit shown by $(SiH_2)_g(NH)_h)$ and a repeating unit shown by $(SiH_2)_iO$ (wherein g, h, and i are 1, 2, or 3) (see JP-A62-195024), a polyborosilazane produced by reacting a polysilazane with a boron compound (see JP-A-2-84437), a polymetallosilazane produced by reacting a polysilazane with a metal alkoxide (see JP-A-63-81122, for example), an inorganic silazane polymer and a modified polysilazane (see JP-A-1-138108, for example), a copolymer silazane produced by introducing an organic component into a polysilazane (JP-A-2-175726, for example), a low-temperature ceramic polysilazane obtained by adding a ceramic-forming catalyst compound to a polysilazane (see JP-A-5-238827, for example),
a silicon alkoxide-addition polysilazane (see JP-A-5-238827), a glycidol-addition polysilazane (see JP-A-6-122852), an acetylacetonato complex-addition polysilazane (see JP-A-6-306329), a metal carboxylate-addition polysilazane (see JP-A-6-299118, for example),
a polysilazane composition produced by adding an amine and/or an acid to the above polysilazane or modified polysilazane (see JP-A-9-31333), a modified polysilazane produced by adding an alcohol (e.g., methanol) or hexamethyldisilazane to the end nitrogen (N) atom of perhydropolysilazane (see JP-A-5-345826 and JP-A-4-63833), and the like.

Among these, perhydropolysilazane in which Rx, Ry, and Rz represent a hydrogen atom is preferable as the polysilazane compound from the viewpoint of availability and an excellent gas barrier capability.

A product commercially available as a glass coating material or the like may be used directly as the polysilazane compound.

The clay mineral-containing layer includes at least one clay mineral in addition to the polysilazane compound. A gas barrier formed article that exhibits excellent gas barrier capability, excellent bending resistance and excellent transparency can be obtained by utilizing the clay mineral.

The clay mineral used in connection with the invention is a mineral that forms clay, and includes a layered silicate mineral as the main component. Clay minerals are formed of layered platelets, and the platelets are isolated from each other by a gallery (i.e., a space that is positioned between the parallel platelets, and includes various ions that bond the platelets).

The thickness of each sheet is normally 3 to 3000 angstroms, and the length of each sheet in the planar direction is normally 0.01 to 100 μm. The aspect ratio of each sheet is normally 10 to 10,000.

Examples of the clay mineral include smectite-group clay minerals such as montmorillonite, saponite, beidellite, nontronite, hectorite, and stevensite, vermiculite, halloysite, and the like. It is preferable to use a smectite-group clay mineral (more preferably montmorillonite) since a formed article that exhibits an excellent gas barrier capability can be obtained.

These clay minerals may be used either alone or in combination.

A commercially available clay mineral may be used as the clay mineral.

Examples of the commercially available clay mineral include CLOISITE (registered trademark) 10A (organic montmorillonite manufactured by Southern Clay Products, sheet thickness: about 0.001 μm (10 angstroms), length in planar direction: about 0.15 to about 0.20 μm), Dellite 67G (manufactured by Sanyo Trading Co., Ltd., sheet thickness: about 0.001 μm (10 angstroms), length in planar direction: about 1 μm), and the like.

The total content of the polysilazane compound and the clay mineral in the clay mineral-containing layer is preferably 50 wt % or more, and more preferably 70 wt % or more, from the viewpoint of obtaining an excellent gas barrier capability and the like.

The content of the clay mineral in the clay mineral-containing layer is preferably 0.01 to 10 mass %, more preferably 0.05 to 5.0 mass %, and particularly preferably 0.1 to 1.0 mass %, based on the total content (=100 mass %) of the polysilazane compound and the clay mineral.

The clay mineral-containing layer may include an additional component other than the polysilazane compound and the clay mineral as long as the object of the invention is not impaired. Examples of the additional component include an additional polymer, a curing agent, an aging preventive, a light stabilizer, a flame retardant, a filler, a pigment, a leveling agent, an antifoaming agent, an antistatic agent, a UV absorber, a pH-adjusting agent, a dispersant, a surface modifier, a plasticizer, a siccative, an antirunning agent, and the like.

The clay mineral-containing layer may be formed by an arbitrary method. For example, the clay mineral-containing layer may be formed by applying a solution that includes at least one polysilazane compound, at least one clay mineral, an optional additional component, a solvent, and the like to an appropriate base layer to form a film, and appropriately drying the film.

It is preferable to use a solvent that stably dissolves the polysilazane and the clay mineral. Examples of such a solvent include xylene, toluene, esters such as butyl carbitol acetate, n-butyl acetate, and ethyl acetate, glycol ethers such as cellosolve and cellosolve acetate, ketones such as acetone and methyl ethyl ketone, and the like.

Two or more solvents may be used in combination in order to adjust the solubility of the polysilazane compound or the like, and the evaporation rate of the solvent. The content of the solvent in the solution for forming the clay mineral-containing layer is determined depending on the coating method, the type of the polysilazane compound, and the like, but is normally 1 to 99 mass %, and preferably 5 to 60 mass %.

A spin coater, a knife coater, a gravure coater, or the like may be used to apply the solution.

It is preferable to heat the film in order to dry the film, and improve the gas barrier capability of the resulting formed article. In this case, the film is heated at 80 to 150° C. for several tens of seconds to several tens of minutes.

The polysilazane compound is thus crosslinked, condensed, optionally oxidized, hydrolyzed, and cured to form a ceramic phase. It is thus possible to obtain a dense film in which a ceramic phase that mainly includes an Si—N bond or an Si—O bond and a clay mineral phase form a complex at a microstructure level.

The thickness of the clay mineral-containing layer is not particularly limited, but is normally 20 nm to 100 μm, preferably 30 nm to 500 nm, and more preferably 40 nm to 200 nm.

According to one embodiment of the invention, a formed article that exhibits a sufficient gas bather capability can be obtained even if the clay mineral-containing layer has a thickness at a nanometer level.

The formed article according to one embodiment of the invention preferably includes a layer obtained by implanting ions into the clay mineral-containing layer (hereinafter may be referred to as "ion-implanted layer"). The ion-implanted layer is not particularly limited as long as the ion-implanted layer is obtained by implanting ions into the clay mineral-containing layer.

Examples of the ions implanted into the clay mineral-containing layer include ions of a rare gas (e.g., argon, helium, neon, krypton, and xenon), a fluorocarbon, hydrogen, nitrogen, oxygen, carbon dioxide, chlorine, fluorine, sulfur, a silicon compound, and a hydrocarbon; ions of a conductive metal (e.g., gold, silver, copper, platinum, nickel, palladium, chromium, titanium, molybdenum, niobium, tantalum, tungsten, and aluminum); and the like.

Among these, ions obtained by ionizing at least one gas selected from the group consisting of hydrogen, nitrogen, oxygen, argon, helium, neon, xenon, krypton, a silicon compound, and a hydrocarbon are preferable due to ease of implantation and a capability to form an ion-implanted layer that exhibits an excellent gas barrier capability and excellent transparency.

Examples of the silicon compound include silane ($SiH_4$) and organosilicon compounds.

Examples of the organosilicon compounds include tetraalkoxysilanes such as tetramethoxysilane, tetraethoxysilane, tetra-n-propoxysilane, tetraisopropoxysilane, tetra-n-butoxysilane, and tetra-t-butoxysilane; substituted or unsubstituted alkylalkoxysilanes such as dim ethyldimethoxysilane, dimethyldiethoxysilane, diethyldimethoxysilane, methyltriethoxysilane, ethyltrimethoxysilane, and (3,3,3-trifluoropropyl)trimethoxysilane;
arylalkoxysilanes such as diphenyldimethoxysilane, and phenyltriethoxysilane, disiloxanes such as hexamethyldisiloxane (HMDSO); aminosilanes such as bis(dimethylamino)dimethylsilane, bis(dimethylamino)methylvinylsilane, bis(ethylamino)dimethylsilane, diethylaminotrimethylsilane, dimethylaminodimethylsilane, tetrakisdimethylaminosilane, and tris(dimethylamino)silane; silazanes such as hexamethyldisilazane, hexamethylcyclotrisilazane, heptamethyldisilazane, nonamethyltrisilazane, octamethylcyclotetrasilazane, and tetramethyldisilazane; cyanatosilanes such as tetraisocyanatosilane; halogenosilanes such as triethoxyfluorosilane; alkenylsilanes such as diallyldimethylsilane and allyltrimethylsilane; substituted or unsubstituted alkylsilanes such as di-t-butylsilane, 1,3-disilabutane, bis(trimethylsilyl)methane, trimethylsilane, tetramethylsilane, tris(trimethylsilyl)methane, tris(trimethylsilyl)silane, and benzyltrimethylsilane; silylalkynes such as bis(trimethylsilyl)acetylene, trimethylsilylacetylene, and 1-(trimethylsilyl)-1-propine;
silylalkenes such as 1,4-bistrimethylsilyl-1,3-butadiyne and cyclopentadienyltrimethylsilane; arylalkylsilanes such as phenyldimethylsilane and phenyltrimethylsilane; allynylalkylsilanes such as propargyltrimethylsilane; alkenylalkylsilanes such as vinyltrimethylsilane; disilanes such as hexamethyldisilane; siloxanes such as octamethylcyclotetrasiloxane, tetramethylcyclotetrasiloxane, and hexamethylcyclotetrasiloxane; N,O-bis(trimethylsilyl)acetamide; bis(trimethylsilyl)carbodiimide; and the like.

Examples of the hydrocarbon include alkanes such as methane, ethane, propane, butane, pentane, and hexane; alkenes such as ethylene, propylene, butene, and pentene; alkadienes such as pentadiene and butadiene; alkynes such as acetylene and methylacetylene; aromatic hydrocarbons such as benzene, toluene, xylene, indene, naphthalene, and phenanthrene; cycloalkenes such as cyclopropane and cyclohexane; cycloalkenes such as cyclopentene and cyclohexene; and the like.

These compounds (ions) may be used either alone or in combination.

The dose may be appropriately determined depending on the application (usage) of the resulting formed article (e.g., gas barrier capability and transparency required for the application), and the like.

Ions may be implanted by an arbitrary method. For example, ions may be implanted into the /clay mineral-containing layer (hereinafter may be referred to as "ion implantation target layer") formed in advance.

Ions may be implanted by applying ions (ion beams) accelerated by applying an electric field, or may be implanted by implanting ions present in plasma (plasma ion implantation method), for example. It is preferable to use the plasma ion implantation method since a formed article that exhibits an excellent gas barrier capability and the like can be conveniently obtained.

The plasma ion implantation method may be implemented by generating plasma in an atmosphere containing a plasma-generating gas, and implanting ions (cations) in the plasma into the surface area of the ion implantation target layer by applying a negative high voltage pulse to the ion implantation target layer, for example.

The thickness of an area in which the ion-implanted layer is formed may be controlled by adjusting the implantation conditions (e.g., type of ion, applied voltage, and implantation time), and may be determined depending on the thickness of the ion implantation target layer, the application (object) of the formed article, and the like. The thickness of an area in which the ion-implanted layer is formed is normally 10 to 1000 nm.

Whether or not ions have been implanted may be determined by performing elemental analysis on the surface area having a depth up to about 10 nm using X-ray photoelectron spectroscopy (XPS).

The shape of the formed article according to one embodiment of the invention is not particularly limited. For example, the formed article may be in the shape of a film, a sheet, a rectangular parallelepiped, a polygonal prism, a tube, or the like. When using the formed article as an electronic device member (described later), the formed article is preferably in the shape of a film or a sheet. The thickness of the film may be appropriately determined depending on the application of the electronic device.

The formed article according to one embodiment of the invention may include only the layer that includes the polysilazane compound and the clay mineral or the ion-implanted layer, or may further include an additional layer. The additional layer may be a single layer, or may include a plurality of identical or different layers.

Examples of the additional layer include a base layer, an inorganic compound layer, an impact-absorbing layer, a conductor layer, a primer layer, and the like.

When the formed article according to one embodiment of the invention is a laminate that includes the layer that includes the polysilazane compound and the clay mineral, or the ion-implanted layer, and the additional layer, these layers may be stacked in an arbitrary order. The layer that includes the polysilazane compound and the clay mineral, or the ion-implanted layer, may be situated at an arbitrary position, but preferably forms the surface of the formed article from the viewpoint of production efficiency and the like. The layer that includes the polysilazane compound and the clay mineral, or the ion-implanted layer, may be formed on one side or each side of the additional layer.

When the formed article according to one embodiment of the invention is a laminate, the thickness of the laminate is not particularly limited, and may be appropriately determined depending on the application of the target electronic device.

Base Layer

A material for forming the base layer is not particularly limited as long as the object of the formed article is not impaired. Examples of the material for forming the base layer include polyimides, polyamides, polyamideimides, polyphenylene ethers, polyether ketones, polyether ether ketones, polyolefins, polyesters, polycarbonates, polysulfones, polyether sulfones, polyphenylene sulfides, polyallylates, clay minerals, cycloolefin polymers, aromatic polymers, and the like.

Among these, polyesters, polyamides, or cycloolefin polymers are preferable due to excellent transparency and versatility. It is more preferable to use polyesters or cycloolefin polymers.

Examples of the polyesters include polyethylene terephthalate, polybuthylene terephthalate, polyethylene naphthalate, polyallylate, and the like.

Examples of the polyamides include wholly aromatic polyamides, nylon 6, nylon 66, nylon copolymers, and the like.

Examples of the cycloolefin polymers include norbornene polymers, monocyclic olefin polymers, cyclic conjugated diene polymers, vinyl alicyclic hydrocarbon polymers, and hydrogenated products thereof. Specific examples of the cycloolefin polymers include APEL (ethylene-cycloolefin copolymer manufactured by Mitsui Chemicals Inc.), ARTON (norbomene polymer manufactured by JSR Corporation), ZEONOR (norbornene polymer manufactured by Zeon Corporation), and the like.

Inorganic Compound Layer

The inorganic compound layer is formed of one or more inorganic compounds. Examples of the inorganic compound that forms the inorganic compound layer include inorganic compounds that can be deposited under vacuum, and exhibit a gas barrier capability, such as inorganic oxides, inorganic nitrides, inorganic carbides, inorganic sulfides, and composites thereof (e.g., inorganic oxynitride, inorganic oxycarbide, inorganic carbonitride, and inorganic oxycarbonitride). Among these, it is preferable to use an inorganic oxide, an inorganic nitride, or an inorganic oxynitride.

Examples of the inorganic oxide include metal oxides shown by $MO_x$.

Note that M represents a metal element. The range of x differs depending on M. For example, $x=0.1$ to 2.0 when M is silicon (Si), $x=0.1$ to 1.5 when M is aluminum (Al), $x=0.1$ to 1.0 when M is magnesium (Mg), $x=0.1$ to 1.0 when M is calcium (Ca), $x=0.1$ to 0.5 when M is potassium (K), $x=0.1$ to 2.0 when M is tin (Sn), $x=0.1$ to 0.5 when M is sodium (Na), $x=0.1$ to 1.5 when M is boron (B), $x=0.1$ to 2.0 when M is titanium (Ti), $x=0.1$ to 1.0 when M is lead (Pb), $x=0.1$ to 2.0 when M is zirconium (Zr), and $x=0.1$ to 1.5 when M is yttrium (Y).

It is preferable to use silicon oxide (M=silicon), aluminum oxide (M=aluminum), or titanium oxide (M=titanium) due to excellent transparency and the like. It is more preferable to use silicon oxide. It is preferable that $x=1.0$ to 2.0 when M is silicon, $x=0.5$ to 1.5 when M is aluminum, and $x=1.3$ to 2.0 when M is titanium.

Examples of the inorganic nitride include metal nitrides shown by $MN_y$.

Note that M represents a metal element. The range of y differs depending on M. For example, $y=0.1$ to 1.3 when M is silicon (Si), $y=0.1$ to 1.1 when M is aluminum (Al), $y=0.1$ to 1.3 when M is titanium (Ti), and $y=0.1$ to 1.3 when M is tin (Sn).

It is preferable to use silicon nitride (M=silicon), aluminum nitride (M=aluminum), titanium nitride (M=titanium), or tin nitride (M=tin) due to excellent transparency and the like. It is more preferable to use silicon nitride (SiN). It is preferable that $y=0.5$ to 1.3 when M is silicon, $y=0.3$ to 1.0 when M is aluminum, $y=0.5$ to 1.3 when M is titanium, and $y=0.5$ to 1.3 when M is tin.

Examples of the inorganic oxynitride include metal oxynitrides shown by $MO_xN_y$.

Note that M represents a metal element. The ranges of x and y differ depending on M. For example, $x=1.0$ to 2.0 and $y=0.1$ to 1.3 when M is silicon (Si), $x=0.5$ to 1.0 and $y=0.1$ to 1.0 when M is aluminum (Al), $x=0.1$ to 1.0 and $y=0.1$ to 0.6 when M is magnesium (Mg), $x=0.1$ to 1.0 and $y=0.1$ to 0.5 when M is calcium (Ca), $x=0.1$ to 0.5 and $y=0.1$ to 0.2 when M is potassium (K), $x=0.1$ to 2.0 and $y=0.1$ to 1.3 when M is tin (Sn), $x=0.1$ to 0.5 and $y=0.1$ to 0.2 when M is sodium (Na), $x=0.1$ to 1.0 and $y=0.1$ to 0.5 when M is boron (B), $x=0.1$ to 2.0 and $y=0.1$ to 1.3 when M is titanium (Ti), $x=0.1$ to 1.0 and $y=0.1$ to 0.5 when M is lead (Pb), $x=0.1$ to 2.0 and $y=0.1$ to 1.0 when M is zirconium (Zr), and $x=0.1$ to 1.5 and $y=0.1$ to 1.0 when M is yttrium (Y).

It is preferable to use silicon oxynitride (M=silicon), aluminum oxynitride (M=aluminum), or titanium oxynitride (M=titanium) due to excellent transparency and the like. It is more preferable to use silicon oxynitride. It is preferable that $x=1.0$ to 2.0 and $y=0.1$ to 1.3 when M is silicon, $x=0.5$ to 1.0 and $y=0.1$ to 1.0 when M is aluminum, and $x=1.0$ to 2.0 and $y=0.1$ to 1.3 when M is titanium.

Note that the metal oxide, the metal nitride, and the metal oxynitride may include two or more types of metals.

The inorganic compound layer may be formed by an arbitrary method. For example, the inorganic compound layer may be formed by deposition, sputtering, ion plating, thermal CVD, plasma CVD, dynamic ion mixing, or the like. Among these, it is preferable to use magnetron sputtering since a laminate that exhibits an excellent gas barrier capability can be conveniently obtained.

The thickness of the inorganic compound layer is not particularly limited, but is preferably 10 to 1000 nm, more preferably 20 to 500 nm, and particularly preferably 50 to 200 nm, from the viewpoint of obtaining a gas barrier capability.

Impact-Absorbing Layer

The impact-absorbing layer prevents a situation in which cracks occur in the inorganic compound layer when an impact is applied to the inorganic compound layer. A material for forming the impact-absorbing layer is not particularly limited. Examples of the material for forming the impact-absorbing layer include acrylic resins, urethane resins, silicone resins, olefin resins, rubber materials, and the like. Among these, acrylic resins, silicone resins, and rubber materials are preferable.

Examples of the acrylic resins include acrylic resins that include at least one polymer selected from a (meth)acrylate homopolymer, a copolymer that includes two or more (meth)acrylate units, and a copolymer of a (meth)acrylate and another functional monomer, as the main component. Note that the term "(meth)acrylic acid" used herein refers to acrylic acid or methacrylic acid (hereinafter the same).

It is preferable to use a (meth)acrylate in which the ester moiety has 1 to 20 carbon atoms, and more preferably a (meth)acrylate in which the ester moiety has 4 to 10 carbon atoms.

Examples of such a (meth)acrylate include butyl (meth)acrylate, pentyl (meth)acrylate, hexyl (meth)acrylate, heptyl (meth)acrylate, octyl (meth)acrylate, 2-ethylhexyl (meth)acrylate, nonyl (meth)acrylate, decyl (meth)acrylate, and the like.

Examples of the functional monomer include hydroxyl group-containing monomers such as hydroxyethyl (meth)acrylate, amide group-containing monomers such as (meth)acrylamide, carboxylic acid group-containing monomers such as (meth)acrylic acid, and the like.

The (meth)acrylate (co)polymer may be produced by solution polymerization, emulsion polymerization, suspension polymerization, or the like. Note that the term "(co)polymer" used herein refers to a homopolymer or a copolymer (hereinafter the same).

The (meth)acrylate (co)polymer may be mixed with a crosslinking agent, and at least partially crosslinked.

Examples of the crosslinking agent include isocyanate crosslinking agents such as tolylene diisocyanate, hexamethylene diisocyanate, and adducts thereof; epoxy crosslinking agents such as ethylene glycol glycidyl ether; aziridine crosslinking agents such as hexa[1-(2-methyl)-aziridinyl]triphosphatriazine; chelate crosslinking agents such as aluminum chelates; and the like.

The crosslinking agent is used in an amount of 0.01 to 10 parts by mass, and preferably 0.05 to 5 parts by mass, based on 100 parts by mass (solid content) of the (meth)acrylate (co)polymer. These crosslinking agents may be used either alone or in combination.

Examples of the silicone resins include silicone resins that include a dimethylsiloxane as the main component.

Examples of the rubber material include rubber materials that include isoprene rubber, styrene-butadiene rubber, polyisobutylene rubber, styrene-butadiene-styrene rubber, or the like as the main component.

The impact-absorbing layer may include additives such as an antioxidant, a tackifier, a plasticizer, a UV absorber, a coloring agent, and an antistatic agent.

A product commercially available as a pressure-sensitive adhesive, a coating material, a sealing material, or the like may also be used as the material for forming the impact-absorbing layer. It is preferable to use a pressure-sensitive adhesive (e.g., acrylic pressure-sensitive adhesive, silicone pressure-sensitive adhesive, or rubber pressure-sensitive adhesive).

The impact-absorbing layer may be formed by an arbitrary method. For example, the impact-absorbing layer may be formed by applying a solution that includes the material (e.g., pressure-sensitive adhesive) for the impact-absorbing layer and an optional component (e.g., solvent) to the layer on which the impact-absorbing layer is to be formed, drying the resulting film, and optionally heating the dried film in the same manner as in the case of forming the polyorganosiloxane compound-containing layer.

Alternatively, the impact-absorbing layer may be deposited on a release base, and transferred to a layer on which the impact-absorbing layer is to be formed.

The thickness of the impact-absorbing layer is normally 1 to 100 µm, and preferably 5 to 50 µm.

Conductor Layer

Examples of a material for forming the conductor layer include metals, alloys, metal oxides, electrically conductive compounds, mixtures thereof, and the like. Specific examples of the material for forming the conductor layer include conductive metal oxides such as antimony-doped tin oxide (ATO), fluorine-doped tin oxide (FTO), tin oxide, zinc oxide, indium oxide, indium tin oxide (ITO), and indium zinc oxide (IZO); metals such as gold, silver, chromium, and nickel; a mixture of a metal and a conductive metal oxide; inorganic conductive substances such as copper iodide and copper sulfide; organic conductive materials such as polyaniline, polythiophene, and polypyrrole; and the like. The conductor layer may be a laminate that includes a plurality of layers formed of these materials.

It is preferable to use a conductive metal oxide (particularly preferably ITO) as the material for forming the conductor layer from the viewpoint of transparency.

The conductor layer may be formed by deposition, sputtering, ion plating, thermal CVD, plasma CVD, or the like. It is preferable to form the conductor layer by sputtering since the conductor layer can be conveniently formed.

When forming the conductor layer by sputtering, a discharge gas (e.g., argon) is introduced into a vacuum chamber. A high-frequency voltage or a direct-current voltage is applied between a target and a substrate to generate plasma. The plasma collides with the target, so that the target material is splashed on the substrate, and adheres to the substrate to obtain a thin film. The target is formed of the material for forming the conductor layer.

The thickness of the conductor layer may be appropriately selected depending on the application and the like. The thickness of the conductor layer is normally 10 nm to 50 µm, and preferably 20 mm to 20 µm.

The surface resistivity of the conductor layer is normally 1000 Ω/sq or less.

The conductor layer may optionally be patterned. The conductor layer may be patterned by chemical etching (e.g., photolithography), physical etching using a laser or the like, vacuum deposition using a mask, sputtering, a lift-off method, printing, or the like.

Primer Layer

The primer layer improves the interlayer adhesion between the base layer and the /clay mineral-containing layer or the ion-implanted layer. A gas barrier film that exhibits excellent interlayer adhesion and surface flatness (smoothness) can be obtained by providing the primer layer.

An arbitrary known material may be used to form the primer layer. Examples of the material that may be used to form the primer layer include silicon-containing compounds; a photopolymerizable composition that includes a photopolymerizable compound formed of a photopolymerizable monomer and/or a photopolymerizable prepolymer, and an initiator that generates radicals at least due to visible light; resins such as a polyester resin, a polyurethane resin (particularly a two-component curable resin that includes an isocyanate compound and a polyacryl polyol, a polyester polyol, a polyether polyol, or the like), an acrylic resin, a polycarbonate resin, a vinyl chloride/vinyl acetate copolymer, a polyvinyl butyral resin, and a nitrocellulose resin; alkyl titanates; ethyleneimine; and the like. These materials may be used either alone or in combination.

The primer layer may be formed by dissolving or dispersing the material for forming the primer layer in an appropriate solvent to prepare a primer layer-forming solution, applying the primer layer-forming solution to one side or each side of the base layer, drying the resulting film, and optionally heating the dried film.

The primer layer-forming solution may be applied to the base layer by a wet coating method. Examples of the wet coating method include dipping, roll coating, gravure coating, knife coating, air knife coating, roll knife coating, die coating, screen printing, spray coating, a gravure offset method, and the like.

The film formed by applying the primer layer-forming solution may be dried by hot-blast drying, heat roll drying, infrared irradiation, or the like. The thickness of the primer layer is normally 10 to 1000 nm.

Ions may be implanted into the primer layer in the same manner as in the case of forming the ion-implanted layer (described later). A gas barrier film that exhibits a more excellent gas barrier capability can be obtained by implanting ions into the primer layer.

The formed article according to one embodiment of the invention has a water vapor transmission rate at a temperature of 40° C. and a relative humidity of 90% of 6.0 g/m$^2$/day or less. The formed article preferably has a water vapor transmission rate at a temperature of 40° C. and a relative humidity of 90% of 1.0 g/m$^2$/day or less, more preferably 0.7 g/m$^2$/day or less, and particularly preferably 0.4 g/m$^2$/day or less. The water vapor transmission rate may be measured using a known gas transmission rate measurement apparatus.

The formed article according to one embodiment of the invention exhibits excellent transparency. When the formed article according to one embodiment of the invention has a film-like or sheet-like shape (hereinafter referred to as "film-like shape"), it is preferable that the formed article exhibit excellent bending resistance, and maintain its gas barrier capability even if the formed article is bent.

Whether or not the formed article according to one embodiment of the invention exhibits excellent transparency may be confirmed by measuring the total light transmittance of the formed article. The total light transmittance (wavelength: 550 nm) of the formed article is preferably 86% or more. The total light transmittance of the formed article may be measured using a known total light transmittance measurement apparatus.

Whether or not the formed article exhibits excellent bending resistance, and maintains its gas barrier capability even when the formed article is bent may be confirmed by bending the film-like formed article, applying a pressure to the formed article, and determining whether or not the bent area has deteriorated after unbending the formed article, and determining whether or not the water vapor transmission rate has decreased to a large extent. The formed article according to one embodiment of the invention preferably has an increase rate of water vapor transmission calculated by the following expression of 600% or less, more preferably 500% or less, still more preferably 150% or less, and particularly preferably 120% or less.

increase rate of water vapor transmission=(water vapor transmission rate after bending)/(water vapor transmission rate before bending)×100   [Expression 1]

The film-like formed article according to one embodiment of the invention advantageously maintains its gas barrier capability as compared with an inorganic film having an identical thickness even when the formed article is bent.

2) Method for Producing Formed Article

A method for producing a formed article according to one embodiment of the invention includes implanting ions into a surface area of a /clay mineral-containing layer of a formed body that includes the /clay mineral-containing layer in a surface area.

In the method for producing a formed article according to one embodiment of the invention, it is preferable to implant ions into a /clay mineral-containing layer of a long formed body that includes the /clay mineral-containing layer in a surface area while feeding the formed body in a given direction.

According to this method, ions can be implanted into a long formed body wound around a feed-out roll while feeding the formed body in a given direction, which can then be wound around a wind-up roll, for example. Therefore, an ion-implanted formed article can be continuously produced.

The long formed body is in the shape of a film. The formed body may include only the /clay mineral-containing layer, or may be a laminate that includes the /clay mineral-containing layer in a surface area, and further includes an additional layer.

The thickness of the formed body is preferably 1 to 500 μm, and more preferably 5 to 300 μm, from the viewpoint of winding/unwinding operability and feeding operability.

Ions may be implanted into the /clay mineral-containing layer by an arbitrary method. It is preferable to form an ion-implanted layer in the surface area of the /clay mineral-containing layer by the plasma ion implantation method.

The plasma ion implantation method includes applying a negative high voltage pulse to the formed body that includes the /clay mineral-containing layer in the surface area and is exposed to plasma to implant ions present in the plasma into the surface area of the /clay mineral-containing layer.

It is preferable to use (A) a plasma ion implantation method that implants ions present in plasma generated by utilizing an external electric field into the surface area of the /clay mineral-containing layer, or (B) a plasma ion implantation method that implants ions present in plasma generated due to an electric field produced by applying a negative high voltage pulse to the /clay mineral-containing layer into the surface area of the /clay mineral-containing layer.

When using the method (A), it is preferable to set the ion implantation pressure (plasma ion implantation pressure) to 0.01 to 1 Pa. When the ion implantation pressure is within the above range, a uniform ion-implanted layer that exhibits an excellent gas barrier capability and the like can be conveniently and efficiently formed.

The method (B) does not require increasing the degree of decompression, allows a simple operation, and significantly reduces the processing time. Moreover, the entire /clay mineral-containing layer can be uniformly processed, and ions present in the plasma can be continuously implanted into the surface area of the /clay mineral-containing layer with high energy when applying a negative high voltage pulse. The method (B) also has an advantage in that a high-quality ion-implanted layer can be uniformly formed in the surface area of the /clay mineral-containing layer by merely applying a negative high voltage pulse to the /clay mineral-containing layer without requiring a special means such as a high-frequency electric power supply (e.g., radio frequency (RF) power supply or microwave power supply).

When using the method (A) or (B), the pulse width when applying a negative high voltage pulse (i.e., during ion implantation) is preferably 1 to 15 μs. When the pulse width is within the above range, a transparent and uniform ion-implanted layer can be formed more conveniently and efficiently.

The voltage applied when generating plasma is preferably −1 to −50 kV, more preferably −1 to −30 kV, and particularly preferably −5 to −20 kV. If the applied voltage is higher than −1 kV, the dose may be insufficient, so that the desired performance may not be obtained. If the applied voltage is lower than −50 kV, the aimed article may be charged during ion implantation, or the formed article may be colored, for example.

Examples of a raw material gas that produces plasma ions include those mentioned above in connection with the formed article.

A plasma ion implantation apparatus is used when implanting ions present in plasma into the surface area of the /clay mineral-containing layer.

Specific examples of the plasma ion implantation apparatus include (α) an apparatus that causes the ion implantation target layer to be evenly enclosed by plasma by superimposing high-frequency electric power on a feed-through that applies a negative high voltage pulse to the ion implantation target layer so that ions present in the plasma are attracted to and collide with the target, and thereby implanted and deposited therein (JP-A-2001-26887), (β) an apparatus that includes an antenna in a chamber, wherein high-frequency electric power is applied to generate plasma, and positive and negative pulses are alternately applied to the ion implantation target layer after the plasma has reached an area around the ion implantation target layer, so that ions present in the plasma are attracted to and implanted into the target while heating the ion implantation target layer, causing electrons present in the plasma to be attracted to and collide with the target due to the positive pulse, and applying the negative pulse while controlling the temperature by controlling the pulse factor (JP-A-2001-156013), (γ) a plasma ion implantation apparatus that generates plasma using an external electric field utilizing a high-frequency electric power supply such as a microwave power supply, and causes ions present in the plasma to be attracted to and implanted into the target by applying a high voltage pulse, (δ) a plasma ion implantation apparatus that implants ions present in plasma generated due to an electric field produced by applying a high voltage pulse without using an external electric field, and the like.

It is preferable to use the plasma ion implantation apparatus (γ) or (δ) since the plasma ion implantation apparatus (γ) or (δ) allows a simple operation, significantly reduces the processing time, and can be continuously used.

A method that utilizes the plasma ion implantation apparatus (γ) or (δ) is described in detail below with reference to the drawings.

FIG. 1 is a view schematically illustrating a continuous plasma ion implantation apparatus that includes the plasma ion implantation apparatus (γ).

In FIG. 1(a), reference sign 1a indicates a long film-like formed body (hereinafter referred to as "film") that includes a /clay mineral-containing layer in the surface area, reference sign 11a indicates a chamber, reference sign 20a indicates a turbo-molecular pump, reference sign 3a indicates a feed-out roll around which the film 1a is wound before ion implantation, reference sign 5a indicates a wind-up roll around which an ion-implanted film (formed article) 1a is wound, reference sign 2a indicates a high-voltage applying rotary can, reference sign 6a indicates a driving roll, reference sign 10a indicates a gas inlet, reference sign 7a indicates a high voltage pulsed power supply, and reference sign 4 indicates a plasma discharge electrode (external electric field). FIG. 1(b) is a perspective view illustrating the high-voltage applying rotary can 2a, wherein reference sign 15 indicates a high-voltage application terminal (feedthrough).

The long film 1a that includes the ion implantation target layer in the surface area is a film in which the /clay mineral-containing layer is formed on a base layer.

In the continuous plasma ion implantation apparatus illustrated in FIG. 1, the film 1a is fed from the feed-out roll 3a in the direction of an arrow X inside the chamber 11a, passes through the high-voltage applying rotary can 2a, and is wound around the wind-up roll 5a. The film 1a may be wound and fed (carried) by an arbitrary method. In one embodiment, the film 1a is fed (carried) by rotating the high-voltage applying rotary can 2a at a constant speed. The high-voltage applying rotary can 2a is rotated by rotating a center shaft 13 of the high-voltage application terminal 15 using a motor.

The high-voltage application terminal 15, the driving rolls 6a that come in contact with the film 1a, and the like are formed of an insulator. For example, the high-voltage application terminal 15, the driving rolls 6a, and the like are formed by coating the surface of alumina with a resin (e.g., polytetrafluoroethylene). The high-voltage applying rotary can 2a is formed of a conductor (e.g., stainless steel).

The feeding speed of the film 1a may be appropriately set. The transfer speed of the film 1a is not particularly limited as long as ions are implanted into the surface area (/clay mineral-containing layer) of the film 1a so that the desired ion-implanted layer is formed when the film 1a is fed from the feed-out roll 3a and wound around the wind-up roll 5a. The film winding speed (feeding speed) is determined depending on the applied voltage, the size of the apparatus, and the like, but is normally 0.1 to 3 m/min, and preferably 0.2 to 2.5 m/min.

The pressure inside the chamber 11a is reduced by discharging air from the chamber 11a using the turbo-molecular pump 20a connected to a rotary pump. The degree of decompression is normally $1 \times 10^{-4}$ to $1 \times 10^{0}$ Pa, and preferably $1 \times 10^{-3}$ to $1 \times 10^{-2}$ Pa.

An ion implantation gas is introduced into the chamber 11a through the gas inlet 10a so that the chamber 11a is filled with the ion implantation gas under reduced pressure. Note that the ion implantation gas also serves as a plasma-generating gas.

Plasma is then generated using the plasma discharge electrode 4 (external electric field). The plasma may be generated by a known method using a high-frequency electric power supply (e.g., RF power supply or microwave power supply).

A negative high voltage pulse 9a is applied from the high voltage pulsed power supply 7a connected to the high-voltage applying rotary can 2a through the high-voltage application terminal 15. When a negative high voltage pulse is applied to the high-voltage applying rotary can 2a, ions present in the plasma are attracted to and implanted into the surface of the film around the high-voltage applying rotary can 2a (arrow Y in FIG. 1(a)), so that a film-like formed article 1b is obtained.

The pressure during ion implantation (i.e., the pressure of plasma gas inside the chamber 11a) is preferably 0.01 to 1 Pa. The pulse width during ion implantation is preferably 1 to 15 μs. The negative high voltage applied to the high-voltage applying rotary can 2a is preferably −1 to −50 kV.

When using a continuous plasma ion implantation apparatus illustrated in FIG. 2, ions are implanted into a /clay mineral-containing layer of a film that includes the /clay mineral-containing layer in a surface area as described below.

Figure 2:
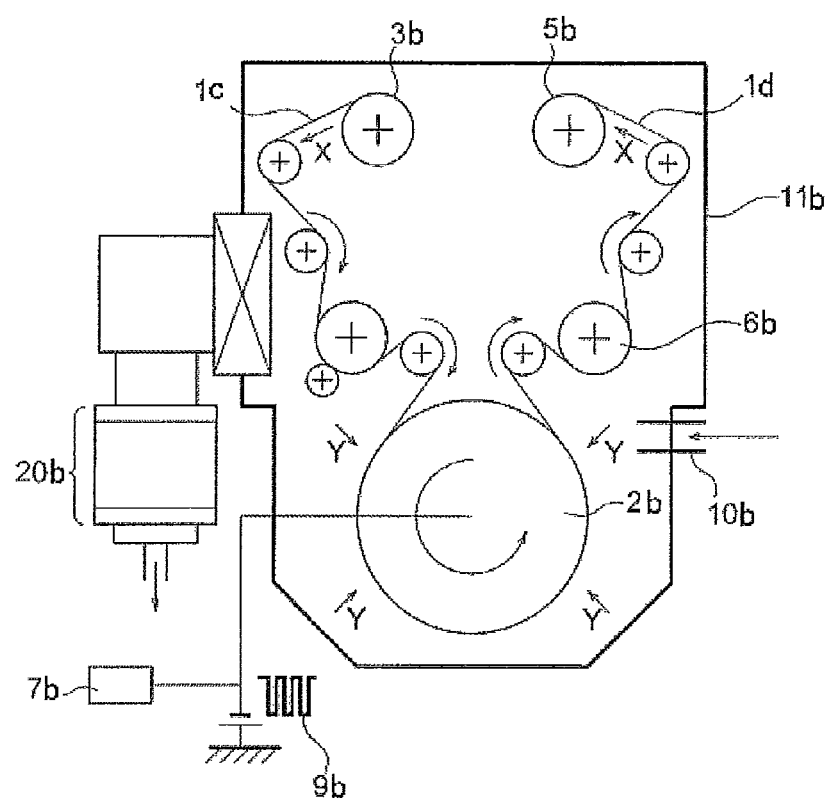
FIG. 2 is a view illustrating a schematic configuration of a plasma ion implantation apparatus.

The apparatus illustrated in FIG. 2 includes the plasma ion implantation apparatus (δ). The plasma ion implantation apparatus (δ) generates plasma by applying only an electric field due to a high voltage pulse without using an external electric field (i.e., the plasma discharge electrode 4 illustrated in FIG. 1).

In the continuous plasma ion implantation apparatus illustrated in FIG. 2, a film (film-like formed body) 1c is fed from a feed-out roll 3b in the direction of an arrow X (see FIG. 2) by rotating a high-voltage applying rotary can 2b, and wound around a wind-up roll 5b.

The continuous plasma ion implantation apparatus illustrated in FIG. 2 implants ions into the surface area of the /clay mineral-containing layer of the film as described below.

The film 1c is placed in a chamber 11b in the same manner as the plasma ion implantation apparatus illustrated in FIG. 1. The pressure inside the chamber 11b is reduced by discharging air from the chamber 11b using a turbo-molecular pump 20b connected to a rotary pump. An ion implantation gas is introduced into the chamber 11b through a gas inlet 10b so that the chamber 11b is filled with the ion implantation gas under reduced pressure.

The pressure during ion implantation (i.e., the pressure of plasma gas inside the chamber 11b) is 10 Pa or less, preferably 0.01 to 5 Pa, and more preferably 0.01 to 1 Pa.

A high voltage pulse 9b is applied from a high voltage pulsed power supply 7b connected to the high-voltage applying rotary can 2b through a high-voltage application terminal (not shown) while feeding the film 1c in the direction X illustrated in FIG. 2.

When a negative high voltage pulse is applied to the high-voltage applying rotary can 2b, plasma is generated along the film 1c positioned around the high-voltage applying rotary can 2b, and ions present in plasma are attracted to and implanted into the surface of the film 1c around the high-voltage applying rotary can 2b (arrow Y in FIG. 2). When ions have been implanted into the surface area of the /clay mineral-containing layer of the film 1c, an ion-implanted layer is formed in the surface area of the film. A film-like formed article 1d is thus obtained.

The applied voltage and the pulse width employed when applying a negative high voltage pulse to the high-voltage applying rotary can 2b, and the pressure employed during ion implantation are the same as those employed when using the continuous plasma ion implantation apparatus illustrated in FIG. 1.

Since the plasma ion implantation apparatus illustrated in FIG. 2 is configured so that the high voltage pulsed power supply also serves as a plasma generation means, a special means such as a high-frequency electric power supply (e.g., RF power supply or microwave power supply) is unnecessary. An ion-implanted layer can be continuously formed by implanting ions present in the plasma into the surface area of the /clay mineral-containing layer by merely applying a negative high voltage pulse. Therefore, a formed article in which an ion-implanted layer is formed in the surface area of a film can be mass-produced.

3) Electronic Device Member and Electronic Device

An electronic device member according to one embodiment of the invention includes the formed article according to one embodiment of the invention. Therefore, since the electronic device member according to one embodiment of the invention exhibits an excellent gas barrier capability, a deterioration in the element (member) due to gas (e.g., water vapor) can be prevented. Since the electronic device member has high light transmittance, the electronic device member may suitably be used as a display member for liquid crystal displays and EL displays; a solar cell backsheet; and the like.

An electronic device according to one embodiment of the invention includes the electronic device member according to one embodiment of the invention. Specific examples of the electronic device include a liquid crystal display, an organic EL display, an inorganic EL display, electronic paper, a solar cell, and the like.

Since the electronic device according to one embodiment of the invention includes the electronic device member that includes the formed article according to one embodiment of the invention, the electronic device exhibits an excellent gas barrier capability, excellent transparency, and excellent bending resistance.

EXAMPLES

The invention is further described below by way of examples. Note that the invention is not limited to the following examples.

The following plasma ion implantation apparatus, water vapor transmission rate measurement apparatus, water vapor transmission rate measurement conditions, total light transmittance measurement apparatus, and bending test method were used in the examples. Note that a apparatus that implants ions using an external electric field was used as the plasma ion implantation apparatus.

Plasma Ion Implantation Apparatus

RF power supply: "RF56000" manufactured by JEOL Ltd.
High voltage pulsed power supply: "PV-3-HSHV-0835" manufactured by Kurita Seisakusho Co., Ltd.

Measurement of Water Vapor Transmission Rate

The water vapor transmission rate was measured using a transmission rate tester "L89-500" (manufactured by LYSSY) (when the water vapor transmission rate was 0.01 g/m$^2$/day or more) or "DELTAPERM" (manufactured by Technolox Ltd.) (when the water vapor transmission rate was less than 0.01 g/m$^2$/day).

The water vapor transmission rate was measured at a temperature of 40° C. and a relative humidity of 90%.

Measurement of Total Light Transmittance

The total light transmittance at a wavelength of 550 nm was measured using a total light transmittance measurement apparatus "UV-3101PC" (manufactured by Shimadzu Corporation).

Bending Test

The formed article was bent at the center so that the ion-implanted layer (side) (the surface of the perhydropolysilazane-containing layer in Comparative Example 1, and the surface of the silicon nitride film in Comparative Example 2) was positioned on the outer side. The formed article was passed between two rolls of a laminator ("LAMI-PACKER LPC1502" manufactured by Fujipla, Inc.) at a laminating speed of 5 m/min and a temperature of 23° C. The bent area was observed using a microscope (magnification: 100) to determine the presence or absence of cracks. A case where cracks were not observed is indicated by "No", and a case where cracks were observed is indicated by "Yes". The water vapor transmission rate after bending was measured, and the increase rate of water vapor transmission was calculated by the following expression.

increase rate of water vapor transmission=(water vapor transmission rate after bending)/(water vapor transmission rate before bending)×100    [Expression 2]

Example 1

A mixture of a coating material containing perhydropolysilazane (polysilazane compound) as the main component ("Aquamika NL110-20" manufactured by Clariant Japan K.K.) and a 0.2 mass % xylene solution in which a clay mineral ("Dellite 67G" manufactured by Sanyo Trading Co., Ltd.) was dispersed, was applied to a polyethylene terephthalate film ("PET38 T-100" manufactured by Mitsubishi Plastics Inc., thickness: 38 μm (hereinafter referred to as "PET film")) (base layer) so that the thickness of the dried film was 150 nm, and heated at 120° C. for 2 minutes to form a perhydropolysilazane/clay mineral-containing layer on the PET film. The content of the clay mineral was 0.1 mass % based on the total solid content (i.e., total content of polysilazane compound and clay mineral)(=100 mass %)(i.e., clay mineral:perhydropolysilazane=0.1:99.9 (mass ratio)).

Argon (Ar) was plasma-ion-implanted into the surface of the perhydropolysilazane/clay mineral-containing layer under the following conditions using the plasma ion implantation apparatus illustrated in FIG. 1 to obtain a formed article 1.
Plasma Ion Implantation Conditions
Plasma-generating gas: argon
Gas flow rate: 100 sccm
Duty ratio: 0.5%
Repetition frequency: 1000 Hz
Applied voltage: −5 kV
RF power supply: frequency: 13.56 MHz, applied electric power: 1000 W
Chamber internal pressure: 0.2 Pa
Pulse width: 5 μs
Processing time (ion implantation time): 5 minutes
Feeding speed: 0.2 m/min Example 2

A formed article 2 was obtained in the same manner as in Example 1, except that the content of the clay mineral was changed to 1 mass % based on the total solid content (i.e., clay mineral:perhydropolysilazane=1:99 (mass ratio)).

Example 3

A formed article 3 was obtained in the same manner as in Example 1, except that the content of the clay mineral was changed to 10 mass % based on the total solid content (i.e., clay mineral:perhydropolysilazane=10:90 (mass ratio)).

Comparative Example 1

A formed article was obtained in the same manner as in Example 1, except that ion implantation was not performed. Specifically, a formed article 4 was obtained by forming a perhydropolysilazane/clay mineral-containing layer on the PET film.

Comparative Example 2

A silicon nitride (SiN) film (thickness: 60 nm) was formed on a PET film by sputtering to obtain a formed article 5.

Comparative Example 3

A formed article was obtained in the same manner as in Example 1, except that the perhydropolysilazane/clay mineral-containing layer was not formed on the PET film. Specifically, a formed article 6 was obtained by plasma ion implantation of argon (Ar) into the surface of the PET film under the same conditions as those employed in Example 1.

Comparative Example 4

A formed article 7 was obtained in the same manner as in Example 1, except that the clay mineral was not used.

The formed articles 1 to 3, 6, and 7 obtained in Examples 1 to 3 and Comparative Examples 3 and 4 were subjected to elemental analysis in the surface area up to a depth of about 10 nm using an XPS apparatus (manufactured by ULVAC-PHI, Incorporated). It was confirmed that ions had been implanted into the formed articles 1 to 3, 6, and 7.

The water vapor transmission rate and the total light transmittance of the formed articles 1 to 7 obtained in Examples 1 to 3 and Comparative Examples 1 to 4 were measured. The measurement results are shown in Table 1.

The formed articles 1 to 7 were also subjected to the bending test to determine the presence or absence of cracks. The results are shown in Table 1.

The water vapor transmission rate was measured after the bending test, and the increase rate of water vapor transmission was calculated. The results are shown in Table 1.

TABLE 1

| | Formed article | Total light transmittance (%) | Water vapor transmission rate (g/m²/day) | | increase rate of water vapor transmission (%) | Cracks |
| --- | --- | --- | --- | --- | --- | --- |
| | | | Before bending | After bending | | |
| Example 1 | 1 | 88 | 0.07 | 0.35 | 500 | No |
| Example 2 | 2 | 86 | 0.40 | 0.49 | 123 | No |
| Example 3 | 3 | 86 | 4.80 | 5.20 | 108 | No |
| Comparative Example 1 | 4 | 92 | 12.32 | 12.43 | 101 | No |
| Comparative Example 2 | 5 | 71 | 0.25 | 1.60 | 640 | Yes |
| Comparative Example 3 | 6 | 82 | 7.98 | 8.07 | 101 | No |
| Comparative Example 4 | 7 | 88 | 0.02 | 0.22 | 1100 | No |

As shown in Table 1, the formed articles 1 to 3 obtained in Examples 1 to 3 had a low water vapor transmission rate (i.e., exhibited an excellent gas barrier capability) and a high total light transmittance (i.e., exhibited excellent transparency).

The formed articles 1 to 3 showed no cracks when subjected to the bending test, and had an increase rate of water vapor transmission of 600% or less (i.e., exhibited excellent bending resistance).

In contrast, the formed articles 4 and 6 obtained in Comparative Examples 1 and 3 had a high water vapor transmission rate (i.e., exhibited a poor gas barrier capability). The formed articles 5 and 7 obtained in Comparative Examples 2 and 4 had a high increase rate of water vapor transmission. The formed article 5 obtained in Comparative Example 2 showed cracks when subjected to the bending test (i.e., exhibited poor bending resistance).

REFERENCE SIGNS LIST 1a, 1c: film-like formed body
1b, 1d: film-like formed article
2a, 2b: rotary can
3a, 3b: feed-out roll
4: plasma discharge electrode
5a, 5b: wind-up roll
6a, 6b: driving roll
7a, 7b: pulsed power supply
9a, 9b: high voltage pulse
10a, 10b: gas inlet
11a, 11b: chamber
13: center shaft
15: high-voltage application terminal
20a, 20b: turbo-molecular pump

The invention claimed is:

1. A method for producing a formed article comprising an ion-implanted layer, the method comprising:
implanting ions into a surface area of a layer comprising a polysilazane compound and a clay mineral to form said ion-implanted layer;
wherein a total content of the polysilazane compound and the clay mineral in the layer comprising the polysilazane compound and the clay mineral is 70 wt % or more.

2. The method according to claim 1, comprising implanting ions of at least one gas selected from the group consisting of hydrogen, nitrogen, oxygen, argon, helium, xenon, neon, krypton, a silicon compound, and a hydrocarbon into the surface area of the layer that includes the polysilazane compound and the clay mineral.

3. The method according to claim 1, wherein the formed article has a water vapor transmission rate at a temperature of 40° C. and relative humidity of 90% of 6.0 g/m²/day or less.

4. The method according to claim 1, wherein the polysilazane compound is a compound that includes a repeating unit shown by a following formula (1):

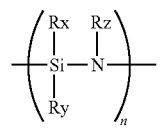

(1)

wherein n is an arbitrary natural number, Rx, Ry, and Rz independently represent a hydrogen atom, a substituted or unsubstituted alkyl group, a substituted or unsubstituted cycloalkyl group, a substituted or unsubstituted alkenyl group, a substituted or unsubstituted aryl group, or an alkylsilyl group.

5. The method according to claim 1, wherein a number average molecular weight of the polysilazane compound is 100 to 50,000.

6. The method according to claim 1, wherein a content of the clay mineral in the layer comprising the polysilazane compound and the clay mineral is 0.01 to 10 mass %, based on a total content (=100 mass %) of the polysilazane compound and the clay mineral.

7. The method according to claim 1, wherein a thickness of the layer comprising the polysilazane compound and the clay mineral is 30 nm to 500 nm.

8. The method for producing the formed article according to claim 1, the method comprising said implanting ions into the layer that includes the polysilazane compound and the clay mineral while feeding the layer including the polysilazane compound and the clay mineral in a given direction.

9. The method according to claim 8, wherein the ions are implanted by a plasma ion implantation method.

10. The method according to claim 1, wherein the ions are implanted by a plasma ion implantation method.

11. The method according to claim 10, wherein the plasma ion implantation method includes applying a negative high voltage pulse to a formed body that includes the layer comprising the polysilazane compound and the clay mineral, wherein the surface area of the layer comprising the polysilazane compound and the clay mineral is exposed to plasma containing ions.

12. The method according to claim 10, wherein the plasma ion implantation method includes implanting ions present in plasma generated by utilizing an external electric field into the surface area of the layer comprising the polysilazane compound and the clay mineral, the plasma ion implantation being performed under a plasma ion implantation pressure of 0.01 to 1 Pa.

13. The method according to claim 1, wherein the formed article further includes a base layer, and the layer comprising the polysilazane compound and the clay mineral is formed on one side or each side of the base layer.

14. The method according to claim 13, wherein a material for forming the base layer is a compound selected from the group consisting of polyimides, polyamides, polyamideimides, polyphenylene ethers, polyether ketones, polyether ether ketones, polyolefins, polyesters, polycarbonates, polysulfones, polyether sulfones, polyphenylene sulfides, polyallylates, clay minerals, cycloolefin polymers, and aromatic polymers.

15. A method for producing a formed article comprising an ion-implanted layer, the method comprising:
implanting ions into a surface area of a layer comprising a polysilazane compound and a clay mineral to form said ion-implanted layer;
wherein the ions are implanted by a plasma ion implantation method;
wherein the plasma ion implantation method includes applying a negative high voltage pulse to a formed body that includes the layer comprising the polysilazane compound and the clay mineral, wherein the surface area of the layer comprising the polysilazane compound and the clay mineral is exposed to plasma containing ions; and
wherein a pulse width when applying the negative high voltage pulse is 1 to 15 µs, and a voltage applied when generating plasma is −1 to −50 kV.

* * * * *